US007999170B2

(12) United States Patent
Prado Lopez et al.

(10) Patent No.: US 7,999,170 B2
(45) Date of Patent: Aug. 16, 2011

(54) ACOUSTIC DRUM SET AMPLIFIER DEVICE SPECIFICALLY CALIBRATED FOR EACH INSTRUMENT WITHIN A DRUM SET

(76) Inventors: Victor Rafael Prado Lopez, San Pedro Sula (HN); Rui Alvaro Prado Lopez, San Pedro Sula (HN)

( * ) Notice: Subject to any disclaimer, the term of this patent is extended or adjusted under 35 U.S.C. 154(b) by 92 days.

(21) Appl. No.: 12/413,473

(22) Filed: Mar. 27, 2009

(65) Prior Publication Data

US 2010/0242713 A1 Sep. 30, 2010

(51) Int. Cl.
*G10H 1/12* (2006.01)
*H03H 7/01* (2006.01)

(52) U.S. Cl. ................ 84/661; 84/622; 84/625; 84/659; 84/660; 84/723; 84/104; 84/411 R

(58) Field of Classification Search ........................ None
See application file for complete search history.

(56) References Cited

U.S. PATENT DOCUMENTS

| | | | | |
|---|---|---|---|---|
| 3,708,603 | A * | 1/1973 | Keagle et al. | 84/695 |
| 3,749,837 | A * | 7/1973 | Doughty | 381/62 |
| 4,227,049 | A | 10/1980 | Thomson et al. | |
| 4,374,300 | A | 2/1983 | Ponto et al. | |
| 4,879,751 | A * | 11/1989 | Franks et al. | 381/119 |
| 5,728,963 | A * | 3/1998 | Reintjes | 84/692 |
| 5,922,981 | A * | 7/1999 | Ballister | 84/464 A |
| 7,282,633 | B1 | 10/2007 | Coolidge | |
| 7,297,863 | B2 | 11/2007 | May | |
| 7,518,055 | B2 * | 4/2009 | Zartarian | 84/615 |
| 2004/0030425 | A1 * | 2/2004 | Yeakel et al. | 700/94 |
| 2004/0131209 | A1 * | 7/2004 | Okabayashi | 381/119 |
| 2005/0157830 | A1 * | 7/2005 | Ota et al. | 375/377 |
| 2008/0034946 | A1 * | 2/2008 | Aimi | 84/604 |
| 2008/0080720 | A1 * | 4/2008 | Jacob et al. | 381/103 |
| 2008/0212798 | A1 * | 9/2008 | Zartarian | 381/103 |
| 2009/0016541 | A1 * | 1/2009 | Goldstein et al. | 381/57 |
| 2009/0136061 | A1 * | 5/2009 | Osborne | 381/107 |
| 2009/0154738 | A1 * | 6/2009 | Pal | 381/309 |
| 2009/0287496 | A1 * | 11/2009 | Thyssen et al. | 704/500 |
| 2010/0230179 | A1 * | 9/2010 | Uchiyama et al. | 178/18.03 |

* cited by examiner

*Primary Examiner* — Marlo Fletcher
(74) *Attorney, Agent, or Firm* — ruben alcoba, esq.

(57) ABSTRACT

An acoustic drum set amplifier specifically calibrated for each instrument within a drum set, specifically a snare drum, a bass drum, a bongo drum, tom-tom drum, a hi-hat, ride cymbal and crash cymbals, for optimizing the sound frequency of the instrument. In operation, an artist using the device might be able to filter, blend, and manipulate an electro-acoustic signal associated with an acoustic drum instrument, either captured by a microphone or generated by an electronic drum module to the artist's preferences while monitoring the sound directed towards an audience at a live performance.

6 Claims, 7 Drawing Sheets

ACOUSTIC DRUM SET AMPLIFIER DEVICE SPECIFICALLY CALIBRATED FOR EACH INSTRUMENT WITHIN A DRUM SET

BACKGROUND

The present invention relates to amplifiers for acoustic instruments, specifically an acoustic drum set amplifier specifically calibrated for each instrument within a drum set for optimizing the sound frequency of the instrument.

The inventor is a musician with extensive knowledge and experience in the music industry; particularly the technical aspects involved in optimizing acoustic sound quality for live performances.

It is imperative not only that each instrument is properly tuned, but that the amplifiers and sound equalizers are properly calibrated so that the desired sound of each instrument is delivered to the audience.

Understandably, each musician wants to have direct input into the sound of his or her instrument that is delivered to the audience.

For this reason live musicians engage in pre-show sound checks to ensure that the sound delivered to the audience corresponds to the sound the musician wishes to deliver. It is during the pre-show sound check that the members of the band, mostly, the guitarists and vocalists, work with the sound engineers of the sound crew to ensure that the sound delivered to the audience corresponds to the desired sound of the musicians.

Even before the sound engineers make any adjustments, the guitarists can make adjustments to the output of their instruments using sound equalizers, pre-amplifiers and traditional amplifiers.

Each sound equalizer, pre-amplifier and amplifier is designed to operate within a specific range of frequencies that correspond to the natural acoustic frequency of the instrument to which the equalizer or amplifier is connected. As such, a pre-amplifier and equalizer designed to operate with a lead guitar or a rhythm guitar that is connected to the pick up and amplifier designed for a bass guitar would not sound like a lead guitar or rhythm guitar, because the range of frequencies associated with a lead guitar or rhythm guitar differs significantly from the range of frequencies associated with a bass guitar.

Sound equalizers, pre-amplifiers and acoustic amplifiers exist for the various guitars, i.e. lead guitar, rhythm guitar, and bass guitar and these same devices exist for the vocalists of the group. In addition to allowing the musician to fine tune the sound of the music that is being delivered to the audience, such devices often also include an output device that allows the musician to hear, in real time, the sound that is delivered to the audience, while the musician is playing. Until the present invention, this was not available to the percussion section of a music group.

To address this problem, the inventor created the present invention, an acoustic drum set amplifier specifically calibrated for each instrument within a drum set for optimizing the sound frequency of each instrument in the drum set. The present invention comprises essentially of an electric power supply input, at least one electro-acoustical sound input channel comprising of an amplifier, at least one selectively operable variable frequency filter, at least one pre-calibrated dynamic compressor, at least one variable frequency manipulator, an electro-acoustical signal mixer, at least one output channel, an output channel volume control, a selectively operable Drum Module In/Out, an alternative monitoring volume control for a drum field mix, and a dedicated playback input channel.

In operation, an electro-acoustical sound input channel is connected to a microphone that is placed in close proximity with each instrument of a percussion drum set, whereby the microphone can capture sound and transmit said sound to the electro-acoustical sound input channels. Using one of the device's selectively operable variable frequency filters to filters signals having frequencies ranging from about 40 Hz to about 300 Hz generated from the electro-acoustical sound input channel amplifier, the user can identify and control any signal having a frequency outside the desired range for that instrument (an "offending signal"). Using one of the device's pre-calibrated dynamic compressors to compresses the electrical signal filtered through the selectively operable variable frequency filter within a predetermined compression range, the user can correct the signal frequency within the compression range. Using one of the device's variable frequency manipulators, the user can manipulate frequencies of the electro-acoustical signal compressed by the pre-calibrated dynamic compressor ranging from about 41 Hz to about 16 Khz and filter electrical signals having frequencies less than 80 Hz, thereby creating a manipulated electro-acoustical signal. Using the device's electro-acoustical signal mixer, the user can mix the electro-acoustical signal with a signal from another source. Each electro-acoustical sound input channel has a corresponding electro-acoustical sound output channel with a dedicated volume control. The device also includes a selectively operable Drum Module In/Out, the selectively operable Drum Module In/Out comprises of at least one output feed and at least one input feed, the input feed is directed to an acoustic/electronic signal blender, the acoustic/electronic signal blender blends the signal from the input feed with the manipulated electro-acoustical signal of the variable frequency manipulator, it is possible that the input feed is generated by an electronic drum module. The device also includes an alternative monitoring volume control for a drum field mix, the alternative monitoring volume control comprises a volume control mechanism that ranges from about −15 DB to about 15 DB, whereby 0 DB corresponds to the volume of the output channel volume control of the electro-acoustical sound output channel., the alternative monitoring volume control further comprises of a dedicated output channel. The device also includes a dedicated playback input channel, the dedicated playback input channel further comprises of a left channel, a right channel and a click track channel, the left channel and right channel share a common volume control and the click track channel has a separate dedicated volume control.

One of the key features of the present invention is that the device is specifically calibrated for frequencies that are produced by a percussion drum and provides for a filtering mechanism to remove frequencies that fall outside of the desired range and allows a percussion artist to adjust the sound that is delivered to an audience based on the preferences of the percussion artist rather than a third person.

Another key feature of the present invention is that the device allows for an artist to selectively blend a manipulated electro-acoustic signal with an electro-acoustic signal generated by a remote source, such as an electronic drum module. The artist may also monitor the sound delivered to the audience through the dedicated playback channel and associated drum field and click tracks.

An objective of the present invention is to provide a device that is specifically calibrated for each instrument within a drum set for optimizing the sound frequency of the instrument.

Another objective of the present invention is to provide a device that allows for the removal of frequencies that fall outside of a desired range.

Another objective of the present invention is to provide a device that allows for a percussion artist to have an active role in the sound that is delivered to an audience.

Another objective of the present invention is to provide a device that allows for the selective blending of manipulated electro-acoustic signal with the natural optimized electro-acoustic signal of a percussion instrument.

Another objective of the present invention is to provide a device that is calibrated to be used with an instrument selected from the group consisting of a snare drum, bass drum, bongo drum, tom-tom drums, a hi-hat, ride cymbal and crash cymbals.

Yet a further objective of the present invention is to provide a device that allows for the selective blending of manipulated electro-acoustic signal with signals generated by remote sources such as electronic drum modules.

Still a further objective of the present invention is to provide a device that allows an artist to monitor the sound of a drum set that is delivered to an audience through a dedicated playback channel and associated drum field and click tracks.

Thomson et al., U.S. Pat. No. 4,227,049, and May, U.S. Pat. No. 7,297,863, and Coolidge, U.S. Pat. No. 7,282,633 disclose various sound augmentation systems for percussion drums and Ponto et al. U.S. Pat. No. 4,374,300 discloses a sound mixer device; however none of the aforementioned references discloses each limitation of the present invention.

For the foregoing reasons there exists a need for an acoustic drum set amplifier specifically calibrated for each instrument within a drum set for optimizing the sound frequency of each instrument in the drum set comprising essentially of an electric power supply input, at least one electro-acoustical sound input channel comprising of an amplifier, at least one selectively operable variable frequency filter, at least one pre-calibrated dynamic compressor, at least one variable frequency manipulator, an electro-acoustical signal mixer, at least one output channel, an output channel volume control, a selectively operable Drum Module In/Out, an alternative monitoring volume control for a drum field mix, and a dedicated playback input channel.

SUMMARY

An acoustic drum set amplifier specifically calibrated for each instrument within a drum set for optimizing the sound frequency of each instrument in the drum set. The present invention comprises essentially of an electric power supply input, at least one electro-acoustical sound input channel comprising of an amplifier, at least one selectively operable variable frequency filter, at least one pre-calibrated dynamic compressor, at least one variable frequency manipulator, an electro-acoustical signal mixer, at least one output channel, an output channel volume control, a selectively operable Drum Module In/Out, an alternative monitoring volume control for a drum field mix, and a dedicated playback input channel.

In operation, an electro-acoustical sound input channel is connected to a microphone that is placed in close proximity with each instrument of a percussion drum, whereby the microphone can capture sound and transmit said sound to the electro-acoustical sound input channels. Using one of the device's selectively operable variable frequency filters to filters signals having frequencies ranging from about 40 Hz to about 300 Hz generated from the electro-acoustical sound input channel amplifier, the user can identify and control any signal having a frequency outside the desired range for that instrument (an "offending signal"). Using one of the device's pre-calibrated dynamic compressors to compresses the electrical signal filtered through the selectively operable variable frequency filter within a predetermined compression range, the user can correct the signal frequency within the compression range. Using one of the device's variable frequency manipulators, the user can manipulate frequencies of the electro-acoustical signal compressed by the pre-calibrated dynamic compressor ranging from about 41 Hz to about 16 Khz and filter electrical signals having frequencies less than 80 Hz, thereby creating a manipulated electro-acoustical signal. Using the device's electro-acoustical signal mixer, the user can mix the electro-acoustical signal with a signal from another source. Each electro-acoustical sound input channel has a corresponding electro-acoustical sound output channel with a dedicated volume control. The device also includes a selectively operable Drum Module In/Out, the selectively operable Drum Module In/Out comprises of at least one output feed and at least one input feed, the input feed is directed to an acoustic/electronic signal blender, the acoustic/electronic signal blender blends the signal from the input feed with the manipulated electro-acoustical signal of the variable frequency manipulator, it is possible that the input feed is generated by an electronic drum module. The device also includes an alternative monitoring volume control for a drum field mix, the alternative monitoring volume control comprises a volume control mechanism that ranges from about −15 DB to about 15 DB, whereby 0 DB corresponds to the volume of the output channel volume control of the electro-acoustical sound output channel., the alternative monitoring volume control further comprises of a dedicated output channel. The device also includes a dedicated playback input channel, the dedicated playback input channel further comprises of a left channel, a right channel and a click track channel, the left channel and right channel share a common volume control and the click track channel has a separate dedicated volume control.

One of the key features of the present invention is that the device is specifically calibrated for frequencies that are produced by a percussion drum and provides for a filtering mechanism to remove frequencies that fall outside of the desired range and allows a percussion artist to adjust the sound that is delivered to an audience based on the preferences of the percussion artist rather than a third person.

Another key feature of the present invention is that the device allows for an artist to selectively blend a manipulated electro-acoustic signal with an electro-acoustic signal generated by a remote source, such as an electronic drum module. The artist may also monitor the sound delivered to the audience through the dedicated playback channel and associated drum field and click tracks

DRAWINGS

These and other features, aspects, and advantages of the present invention will become better understood with regard to the following description, appended claims and drawings where:

FIG. 1 and 1*a* are side elevation views of one embodiment of the device;

DESCRIPTION

Figure 1:
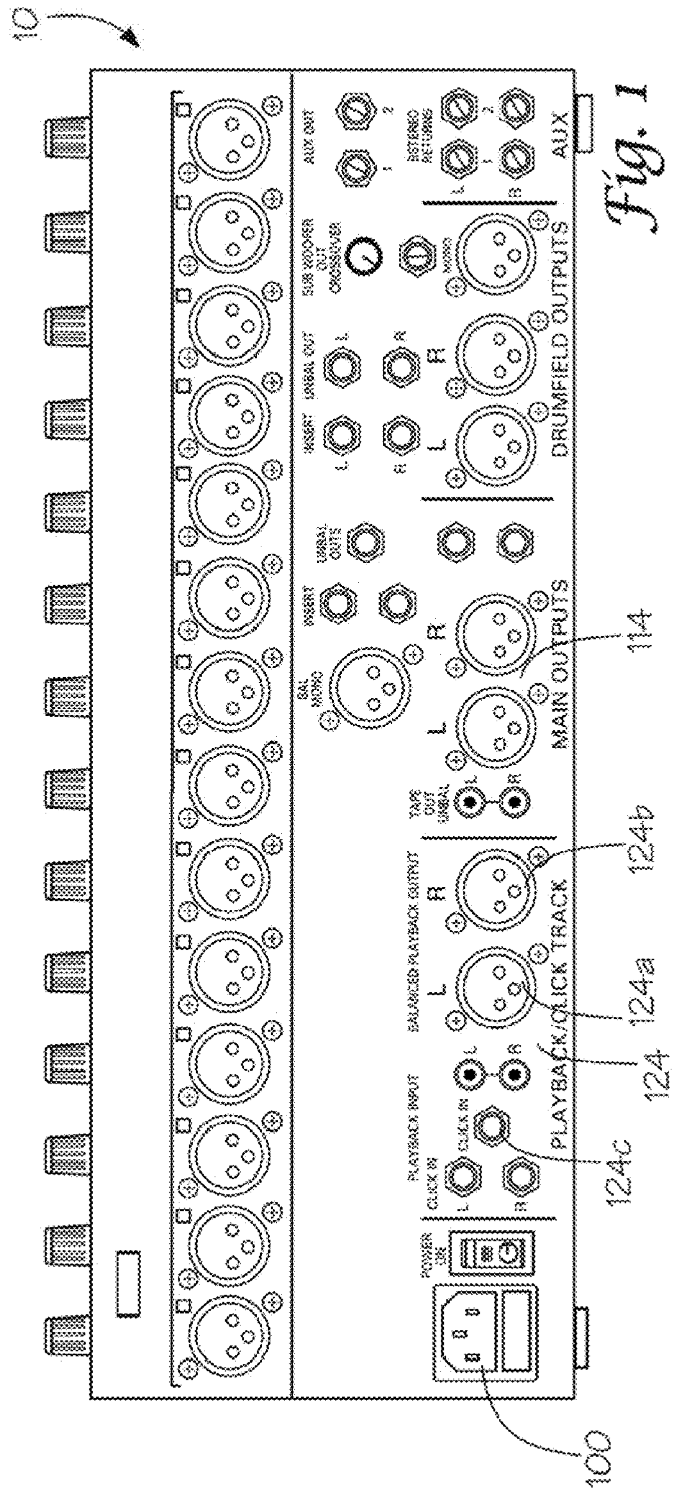
Figure 1A:
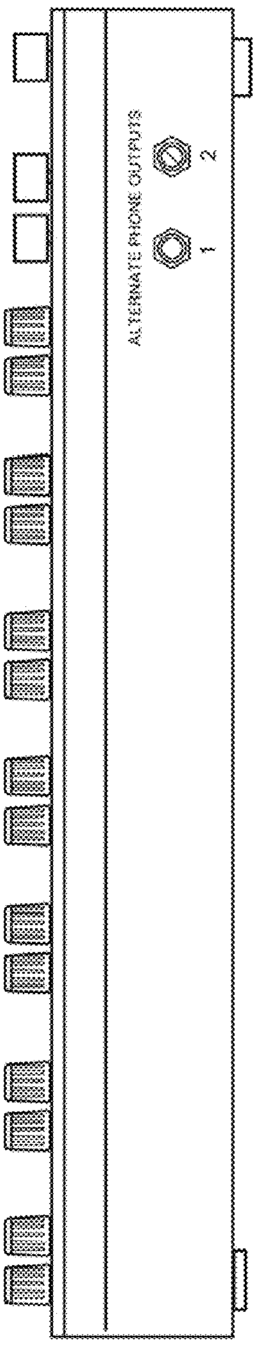
Figure 2A:
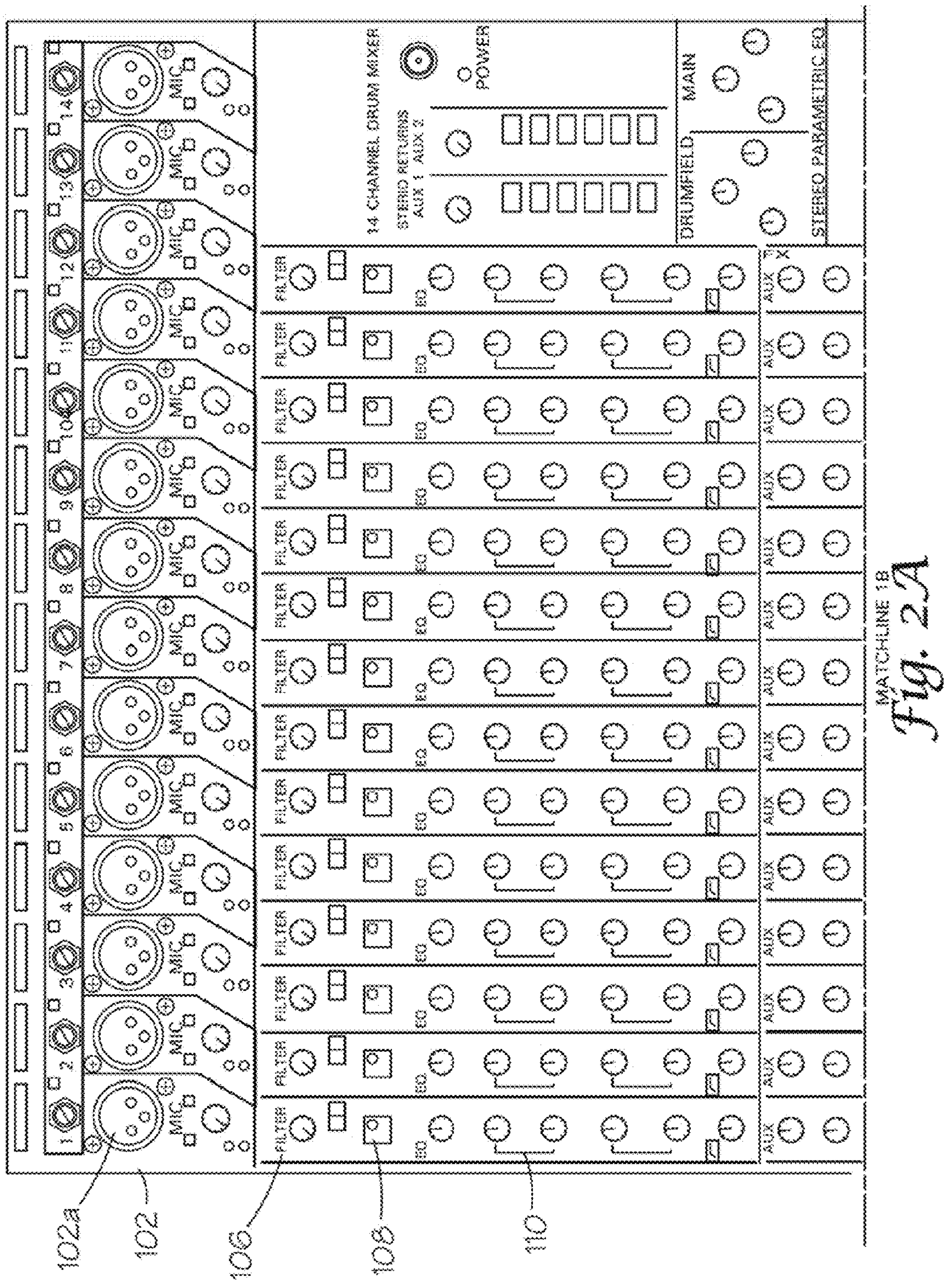
FIG. 2A-2B is a top plan view of one embodiment of the device.
Figure 2B:
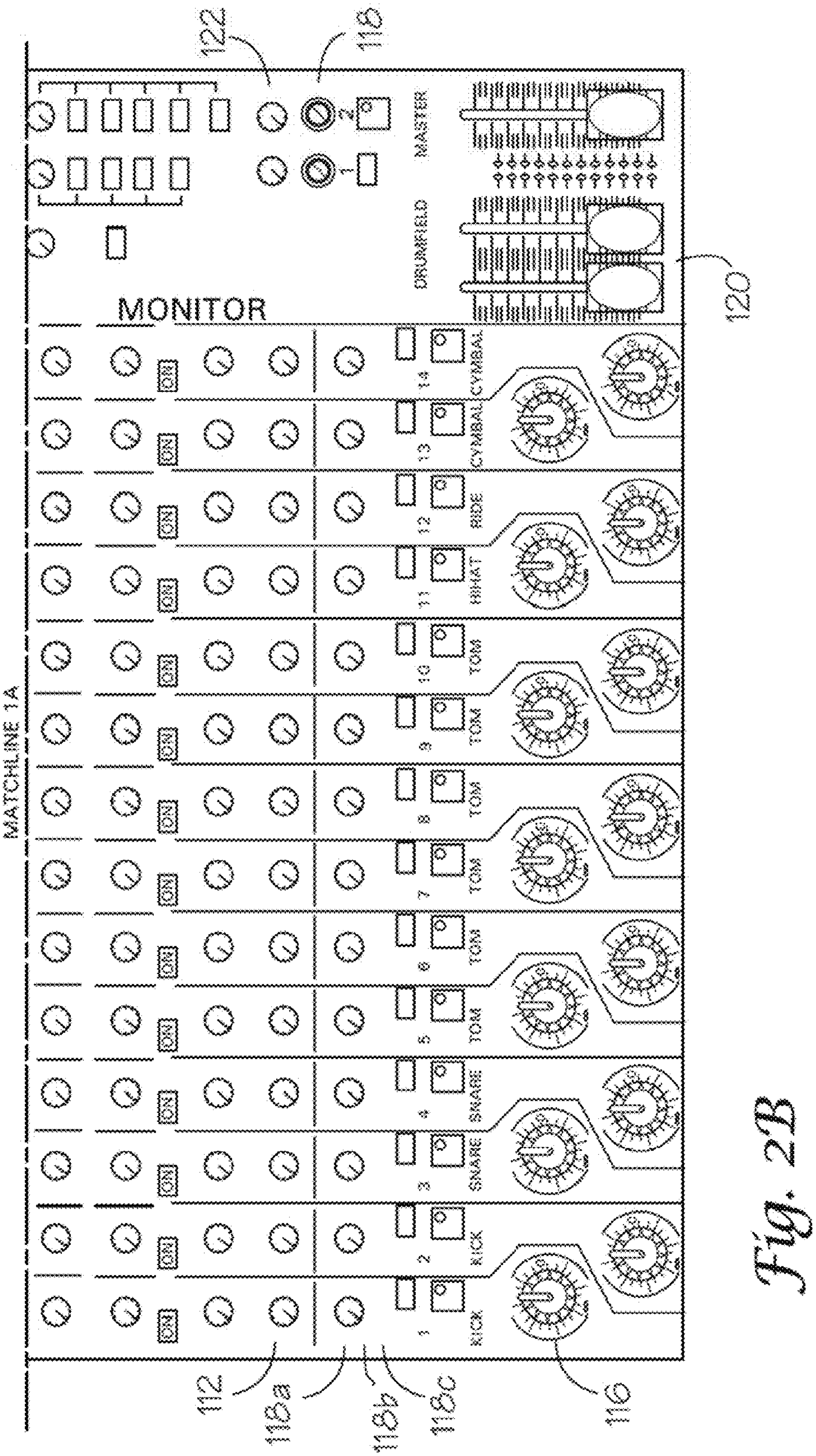
Figure 3A:
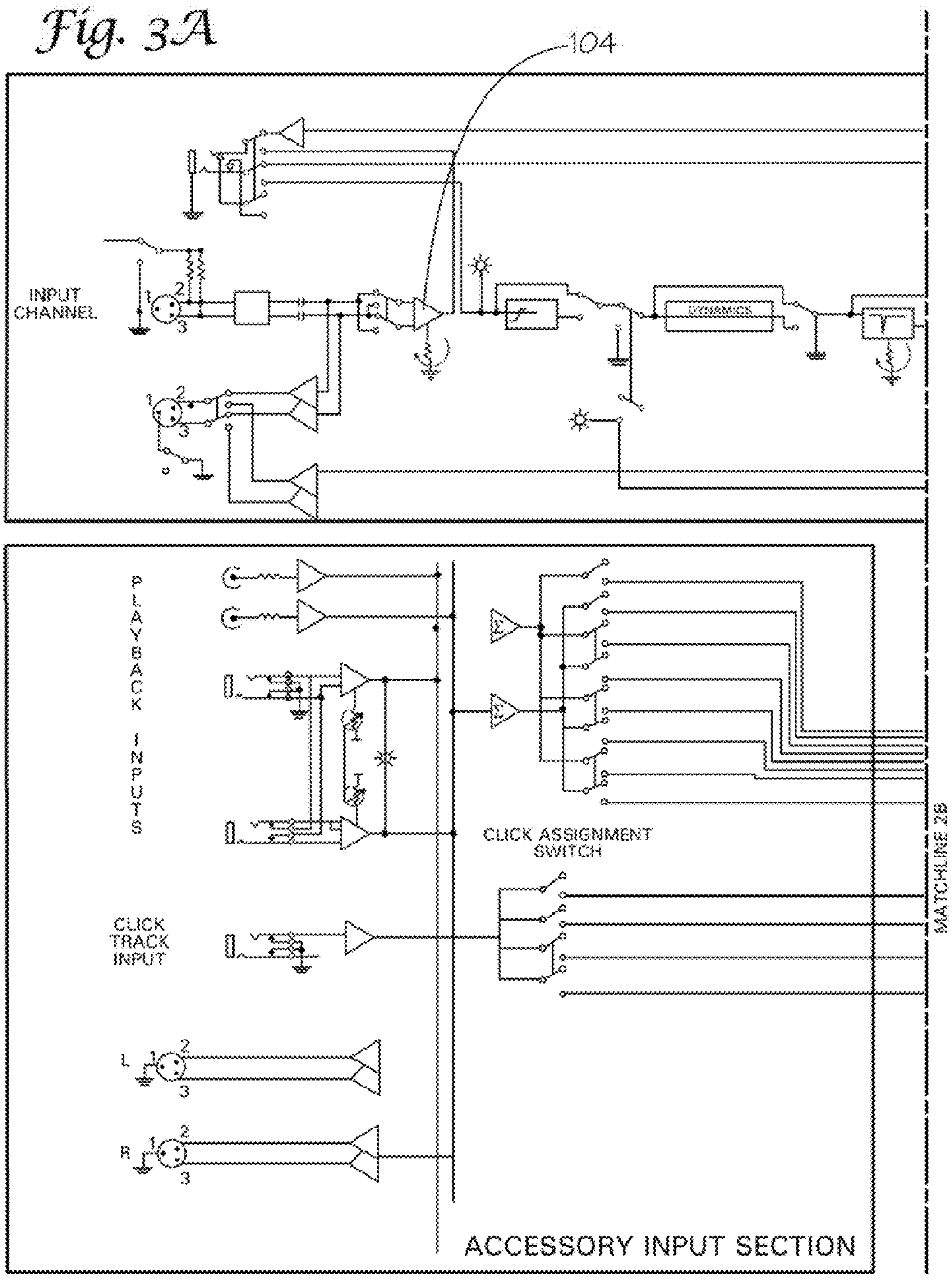
FIG. 3A-3D is a detailed schematic diagram of one embodiment of the device.
Figure 3B:
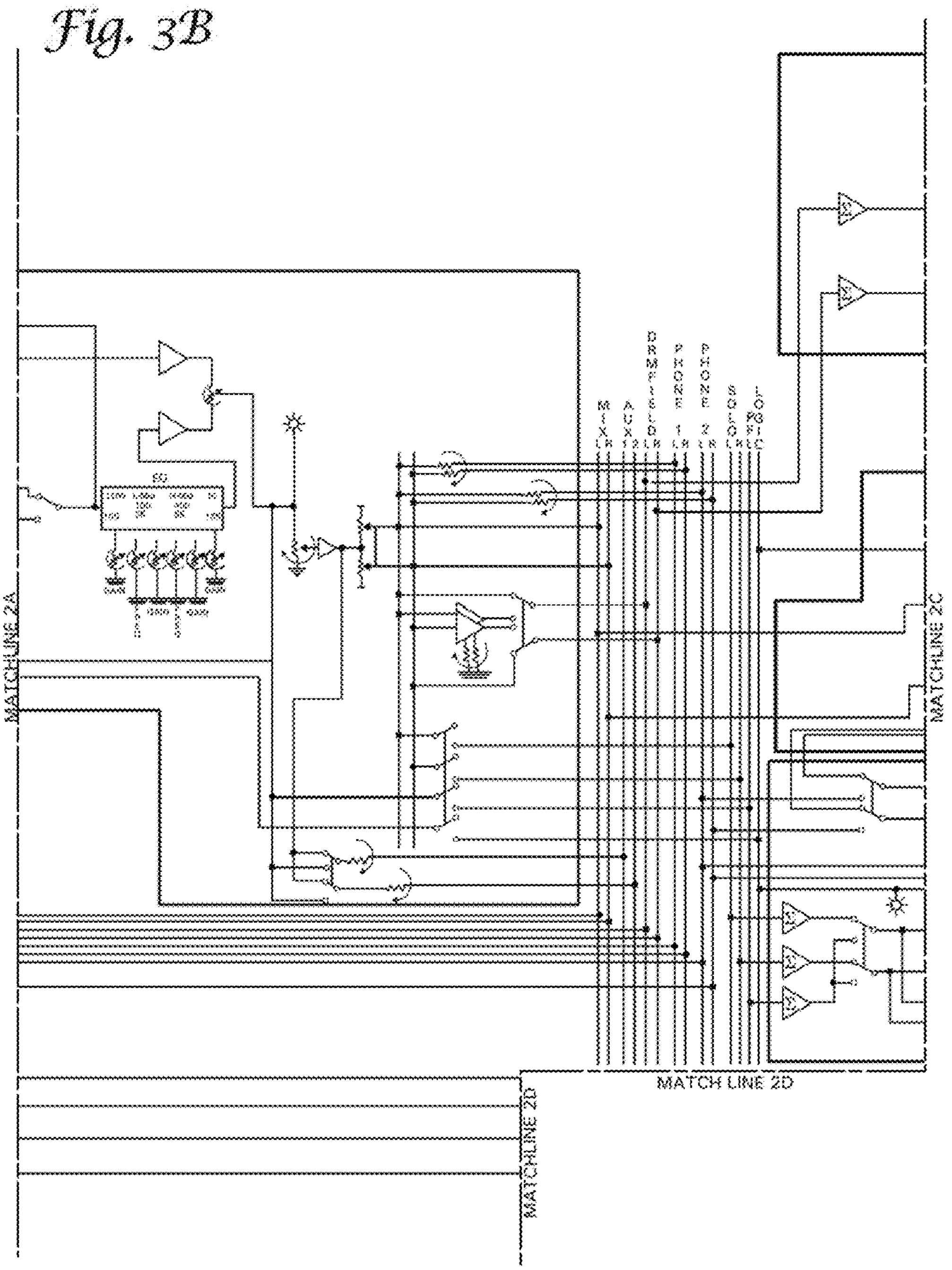
Figure 3C:
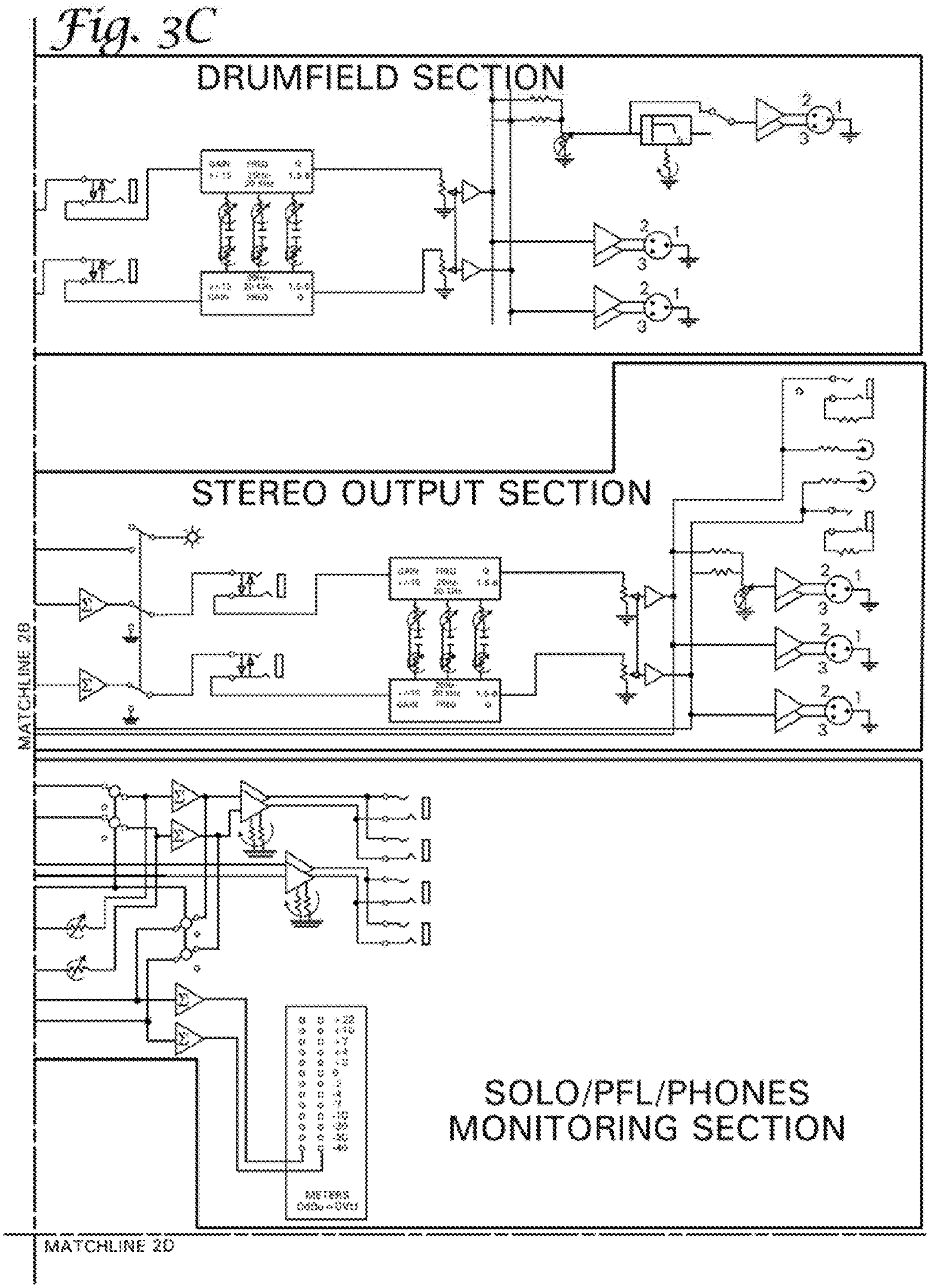
Figure 3D:
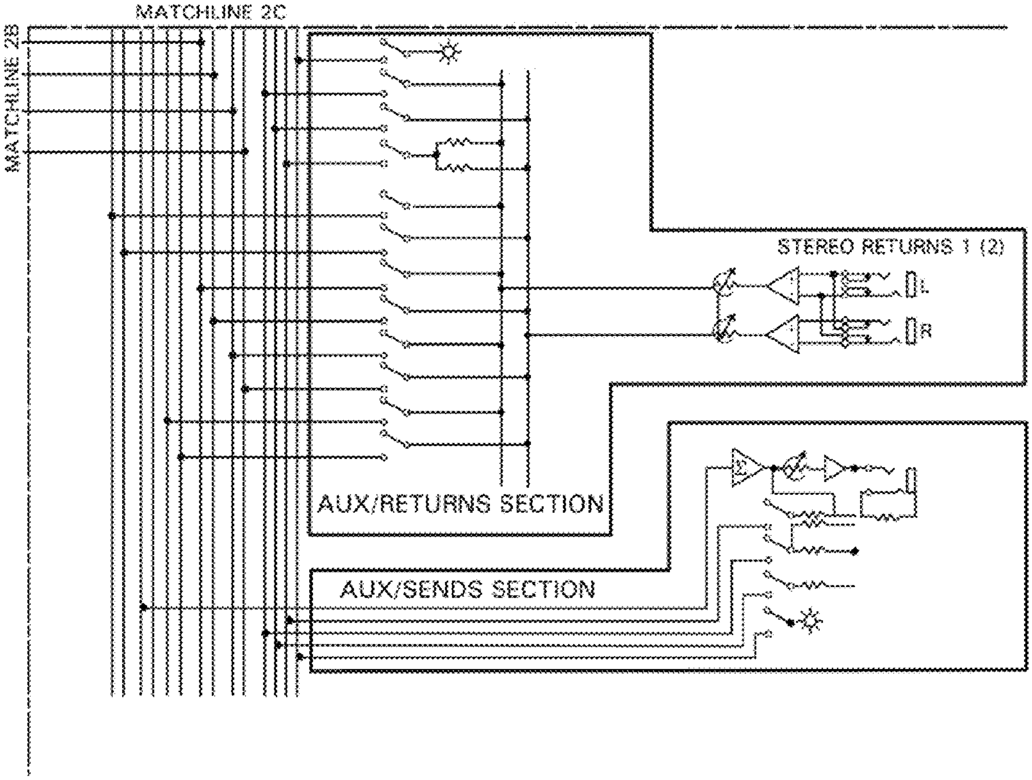

As shown in FIGS. 1-2, one embodiment of an acoustic drum set amplifier device specifically calibrated for each instrument within a drum set 10 is depicted. The device 10 comprises of an electric power supply input 100, at least one electro-acoustical sound input channel 102, an amplifier 104, at least one selectively operable variable frequency filter 106, at least one pre-calibrated dynamic compressor 108, at least one variable frequency manipulator 110, an electro-acoustical signal mixer 112, at least one output channel 114, an output channel volume control 116, a selectively operable Drum Module In/Out 118, an alternative monitoring volume control for a drum field mix 120, a dedicated output channel for the alternative monitoring volume control 122, a dedicated playback input channel 124, the dedicated playback input channel further comprises of a left channel 124*a*, a right channel 124*b* and a click track channel 124*c*; each of the aforementioned elements of the device 10 are arranged and configured with one and other to form an electro-acoustic circuit using electro-acoustic connections and electro-acoustic circuitry known in the art.

The electro-acoustical sound input channel 102 is connected to the power supply input 100 and further comprises of a microphone connector XRL 102*a* sized and configured to receive a microphone cable known in the art and is the point of entry for the electro-acoustical signal detected by said microphone. It is envisioned that each channel 102 might be labeled with the name of the designated percussion instrument of the drum set as each channel 102 is for that specific instrument. Moreover each EQ/Filter/Dynamics(Compressor) Etc. is calibrated for the particular instrument associated with the designated channel 102. In an embodiment of the device 10 with fourteen (14) channels 102 it is envisioned that the labeling might be as follows: CH 1-Kick 1: Bass Drum, CH2-Kick 2: Bass Drum, CH3-Snare 1, CH4-Snare 2, CH5-Tom 8", CH6-Tom 10", CH7-Tom 12"-13", CH8-Tom 14"-15", CH9-Tom 16", CH10-Tom 18", CH11-Hi-Hat, CH12-Ride, CH13-Cymbals L, CH14-Cymbals R, whereby each label corresponds to a specific instrument in a drum set. It is further envisioned that each channel 102 might be connected to an amplifier 104 that increases the intensity of the signal captured by the microphone connected to the microphone connector XRL 102*a* to generate an electro-acoustic signal. It is further envisioned that each channel 102 might further comprise of a designated insertion point to add external processing mechanisms e.g. dynamics, EQ, or other such effects. It is also envisioned that each channel 102 might have a dedicated switch to convert said insertion point into a direct output/input for sending an acoustic drum signal to a Drum Sound Module. In doing so, said signal might therefore function as a trigger for said Drum Sound Module and also receive the Drum Sound Module signal for blending with an acoustic sound. Each channel 102 is connected to the electric power supply input 100.

The selectively operable variable frequency filter 106 is designed and configured to filter signals including electro-acoustic signals, having frequencies ranging from about 40 Hz to about 300 Hz to identify and control any signal having a frequency outside of said desired range. It is envisioned that the signal to be filtered by the selectively operable variable frequency filter 106 might be generated by the amplifier 104 of the electro-acoustical sound input channel 102. The selectively operable variable frequency filter 106 is designed to identify and control problem frequencies. It is envisioned that the selectively operable variable frequency filter 106 might have a designated on/off switch and frequency sweep potentiometer for frequency scanning. It is further envisioned that the range of frequencies for each selectively operable variable frequency filter 106 might vary depending on the corresponding percussion instrument of the drum set. The selectively operable variable frequency filter 106 might be connected to inter alia, the electro-acoustical sound input channel 102 as part of the electro-acoustic circuit of the device 10.

The pre-calibrated dynamic compressor 108 is designed and configured to compress the electrical signal filtered through the selectively operable variable frequency filter 106 within a predetermined compression range. It is envisioned that the pre-calibrated dynamic compressor 108 might be configured for a specific channel/drum/percussion instrument. It is envisioned that the range of compression will be dependant on the dynamics of the signal being compressed. It is envisioned that the pre-calibrated dynamic compressor 108 might have a dedicated on/off switching and all parameters for each percussion instrument might be fixed thereby making the pre-calibrated dynamic compressor 108 more user friendly. The pre-calibrated dynamic compressor 108 might be connected to, inter alia, the selectively operable variable frequency filter 106 as part of the electro-acoustic circuit of the device 10.

The variable frequency manipulator 110 is designed and configured to manipulate frequencies of the electro-acoustical signal compressed by the pre-calibrated dynamic compressor 108 ranging from about 41 Hz to about 16 Khz, the variable frequency manipulator 110 further comprises of a selectively operable fixed frequency filter that filters electrical signals having frequencies less than 80 Hz. It is envisioned that variable frequency manipulator 110 connected to each channel 102 might be tailored for the specific instrument of the drum set. The variable frequency manipulator 110 might be connected to, inter alia, the pre-calibrated dynamic compressor 108 as part of the electro-acoustic circuit of the device 10.

By way of example a channel 102 labeled "SNARE", where one would connect a microphone to capture the sound of snare drum, would have the frequency parameters to operate within the acoustical range of a snare drum. As such, set up time associated with sound checks is greatly reduced because the moment one connects the microphone the channel itself will only operate within those parameters and the sound will be the sound of a snare drum. It is envisioned that a user would be able adjust the sound, i.e. sweeten the sound to the particular taste of the artist; however the sound will always remain within the frequency range, i.e. the color and sound, of a snare drum.

It is envisioned that the variable frequency manipulator 110 might essentially comprise of a three band equalizer with fixed frequencies: LO, MID, HI frequencies. It is further envisioned that the variable frequency manipulator 110 might be labeled with intuitive and descriptive words, so that any performer with or without audio training can easily operate the device.

The electro-acoustical signal mixer 112 is designed and configured to mix electro-acoustical signals that are generated, filtered, or manipulated by or from components of the device, i.e. the amplifier 104 of the electro-acoustical sound input channel 102, selectively operable variable frequency filter 106, the pre-calibrated dynamic compressor 108, the variable frequency manipulator 110, or signals that are generated by other devices, even satellite devices such as electronic drum modules or other similar devices known in the art. The electro-acoustical signal mixer 112 might be connected to, inter alia, the variable frequency manipulator 110 as part of the electro-acoustic circuit of the device 10.

The device 10 comprises of at least one output channel 114 and at least one output channel volume control 116. Each output channel 114 and output channel volume control 116 are connected to the device using electro-acoustic connections and circuitry known in the art to provide an output channel for the device and volume control for said output channel. It is envisioned that the each output channel 114 might further comprise of a Stereo Parametric Equalizer, wherein the stereo parametric equalizer might be designed and configured to tailor and control the main output signal of the device 10. It is envisioned that said stereo parametric one band equalizer might have a Frequency control range of 20 Hz to 20 KHz to identify and cutout any offending frequency that may be out of a desired range. It is envisioned that said Stereo Parametric EQ will serve as a surgical tool for the artist in that the artist will be able to locate and single out any frequency with individual frequency precision. The output volume control 116 is designed and configured with a twenty-four stepped, linear ladder type stepped attenuator potentiometer instead of the common fader type volume control. It is envisioned that such a volume control might provide more secure control for an artist performing on stage. Specifically, the stepped attenuator potentiometer contemplated in the output channel volume control 116 is designed with step locks that only move when intended and will not move from the vibrations associated with a live performance. Each output channel 114 and each output channel volume control 116 might be connected to the electro-acoustical signal mixer 112 as part of the electro-acoustic circuit of the device 10.

The selectively operable Drum Module In/Out 118 comprises of at least one output feed **118*a* and at least one input feed 118*b*, the input feed 118*b* is directed to an acoustic/electronic signal blender 118*c*. The acoustic/electronic signal blender 118*c* is designed and configured to blend the signal from the input feed 118*b* with the manipulated electro-acoustical signal of the variable frequency manipulator 110. It is envisioned that a signal source connected to the input feed 118*b* might be an electronic drum module or other similar devices known in the art. It is envisioned that the acoustic/electronic signal blender 118*c* might be arranged and configured to blend the electro-acoustic signal of an electronic drum module with the electro-acoustic signals of a microphone positioned to capture the sound produced by an acoustic drum instrument. It is further envisioned that the acoustic/electronic signal blender 118*c* might have parameters arranged in a continuum labeled Wet and Dry, where Wet corresponds to a signal that is generated exclusively by the electronic drum module and dry corresponds to an electro-acoustic signal generated exclusively by microphone positioned to capture the sound produced by the acoustic drum instrument. The selectively operable Drum Module In/Out 118 is connected and configured as part of the electro-acoustic circuit of the device 10**.

The alternative monitoring volume control 120 for a drum field mix comprises a volume control mechanism that ranges from about −15 DB to about 15 DB, whereby 0 DB corresponds to the volume of the output channel volume control 116, the alternative monitoring volume control 120 further comprises of a dedicated output channel 122. The alternative monitoring volume control 120 is designed to allow an artist to monitor the sound delivered to the audience through a set of speakers within the vicinity of the performer which is known in the art as the Drumfield. It is envisioned that the alternative monitoring volume control 120 might have a volume control that allows an artist to control certain volume and routing options. It is further envisioned that the alternative monitoring volume control 120 might have a volume control that ranges from about −15 DB to about 15 DB, whereby 0 db corresponds to the volume of output channel volume control 116 and a separate volume control dedicated to the Drumfield output. It is envisioned that the each Drumfield output might further comprise of a Stereo Parametric Equalizer, wherein the stereo parametric equalizer might be designed and configured to tailor and control the main output signal of the device 10. It is envisioned that said stereo parametric one band equalizer might have a Frequency control range of 20 Hz to 20 KHz to identify and cutout any offending frequency that may be out of a desired range. It is envisioned that said Stereo Parametric EQ will serve as a surgical tool for the artist in that the artist will be able to locate and single out any frequency with individual frequency precision. The alternative monitoring volume control 120 is connected and configured as part of the electro-acoustic circuit of the device 10.

In one embodiment of the present invention, it is envisioned that each dedicated output channel 122 might further comprise of a Subwoofer Balanced Output with Crossover. Said Subwoofer Balanced Output with Crossover contemplated by this invention might be designed and configured to serve as an additional balanced mono output to amplify the lower bass frequencies whereby said Subwoofer Balanced Output with Crossover might be provided with a crossover for frequency tuning for frequency output selection. It is envisioned that an artist might select the range of the frequencies to be outputted ranging from about 40 Hz to about 200 Hz. It is envisioned that this feature might also be a part of the Drumfield monitoring to enhance the lower frequencies for more bass presence.

In another embodiment of the present invention, it is envisioned that each dedicated output channel 122 might further comprise of a Drum Field Stereo Balanced Output with insert. Said Drum Field Stereo Balanced Outputs are envisioned to include Stereo or Mono Outputs with both balanced and unbalanced signals. It is envisioned that all signals controlled in the Drumfield section will be outputted through these outputs and it is envisioned that a direct insertion point might be included to allow the insertion of external processors such as external equalizers, compressor or effects directed to the Drumfield output signal.

The dedicated playback input channel 124, further comprises of a left channel **124*a*, a right channel 124*b* and a click track channel 124*c*. The dedicated playback input channel 124 allows for the managing of the signal of a playback or audio track that might be a pre-recorded track that the artist may play with while performing. It is a common practice to play along audio tracks which provides instrumentation to a small group of performers where more instruments are need to be played but no more performers are available. In the music industry, it is also common practice that the drummer is the member of the group that is in charge with this task, as it is the drummer who keeps the group in rhythm during the performance. A click track is often included in the playback audio track. It has the tempo beat needed to mark the pace of the performance. As it is possible that an audio track might be provided in a multi-track (3 tracks) format, whereby for example, the audio track with the instrumentation might be in a stereo format and the click track might be a third track or even a stereo format (2 tracks) having the audio portion for instrumentation directed to the left or right side of the stereo spectrum and the click track in the other side of the spectrum, the present device envisions a playback routing capability that allows the playback to be directed wherever it might be needed. For example, if the click track is directed to the left side and the instrumentation portion is directed to the right side, one can redirect the left side or click track to any destination wanted such as a headphone output or drum field output. The dedicated playback input channel 124 is connected and configured as part of the electro-acoustic circuit of the device 10**.

It is envisioned that the click track channel 124*c*, might include a click input mechanism designed and configured to separate and connect the click track input to the playback. Such a mechanism is provided to allow a level of control and routing options for the artist. It is contemplated that when playback is provided in a multi-track format (3 Tracks) the third track would be the click track and it can be connected to the click input mechanism.

It is envisioned that the device 10, might be calibrated to be used with a snare drum, a bass drum, a bongo drum, a tom-tom drums, a hi-hat, ride cymbal and crash cymbals or another percussion instrument or instrument of a drum set.

In operation, an artist using the device 10 might be able to filter, blend, and manipulate an electro-acoustic signal associated with an acoustic drum instrument, either captured by a microphone or generated by an electronic drum module to the artist's preferences while monitoring the sound directed towards an audience at a live performance. It is further envisioned that an embodiment of the device 10 might be used in connection with a computer platform or have a compatible software program.

An advantage of the present invention is that it provides a device that is specifically calibrated for each instrument within a drum set for optimizing the sound frequency of the instrument.

Another advantage of the present invention is that it provides a device that allows for the removal of frequencies that fall outside of a desired range.

Another advantage of the present invention is that it provides a device that allows for a percussion artist to have an active role in the sound that is delivered to an audience.

Another advantage of the present invention is that it provides a device that allows for the selective blending of manipulated electro-acoustic signal with the natural optimized electro-acoustic signal of a percussion instrument.

Another advantage of the present invention is that it provides a device that is calibrated to be used with an instrument selected from the group consisting of a snare drum, bass drum, bongo drum, tom-tom drum, a hi-hat, ride cymbal and crash cymbals.

Yet a further advantage of the present invention is that it provides a device that allows for the selective blending of manipulated electro-acoustic signal with signals generated by remote sources such as electronic drum modules.

Still a further advantage of the present invention is that it provides a device that allows an artist to monitor the sound of a drum set that is delivered to an audience through a dedicated playback channel and associated drum field and click tracks.

Although the present invention has been described in considerable detail with reference to certain preferred versions thereof, other versions are possible. Therefore, the spirit and the scope of the claims should not be limited to the description of the preferred versions contained herein.

What is claimed is:

1. An acoustic drum set amplifier device specifically calibrated for each instrument within a drum set comprising:

an electric power supply input;

at least one electro-acoustical sound input channel that receives an electro-acoustical signal captured by a microphone, the electro-acoustical sound input channel comprises of an amplifier that increases the intensity of the signal received by the microphone to generate an electro-acoustic signal, said electro-acoustical sound input channel is connected to said electric power supply input;

at least one selectively operable variable frequency filter that filters signals having frequencies ranging from about 40 Hz to about 300 Hz generated from the electro-acoustical sound input channel amplifier, to identify and control any signal having a frequency outside of the desired range, said selectively operable variable frequency filter is connected to said electro-acoustical sound input channel;

at least one pre-calibrated dynamic compressor that compresses the electrical signal filtered through the selectively operable variable frequency filter within a predetermined compression range, said pre-calibrated dynamic compressor is connected to said selectively operable variable frequency filter;

at least one variable frequency manipulator that manipulates frequencies of the electro-acoustical signal compressed by the pre-calibrated dynamic compressor ranging from about 41 Hz to about 16 Khz, the variable frequency manipulator further comprises of a selectively operable fixed frequency filter that filters electrical signals having frequencies less than 80 Hz, said variable frequency manipulator is connected to said pre-calibrated dynamic compressor;

an electro-acoustical signal mixer, said electro-acoustic signal mixer is connected to said variable frequency manipulator, the electrical acoustical signal mixer receives the manipulated frequencies from each frequency manipulator and further mixes the manipulated signal;

at least one output channel, said output channel is connected to said electro-acoustic signal mixer, each output channel receives the manipulated signal from the electro-acoustical signal mixer and then provides a mixed manipulated output signal; and an output channel volume control, said output channel volume control is connected to said output channel.

2. The device of claim 1, further comprising of a selectively operable Drum Module In/Out, the selectively operable Drum Module In/Out comprises of at least one output feed and at least one input feed, the input feed is directed to an acoustic/electronic signal blender, the acoustic/electronic signal blender blends the signal from the input feed with the manipulated electro-acoustical signal.

3. The device of claim 2 further comprising an alternative monitoring volume control for a drum field mix, the alternative monitoring volume control comprises a volume control mechanism that ranges from about −15 DB to about 15 DB, whereby 0 DB corresponds to the volume of the output channel volume control, the alternative monitoring volume control further comprises of a dedicated output channel.

4. The device of claim 3 further comprising a dedicated playback input channel, the dedicated playback input channel further comprises of a left channel, a right channel and a click track channel, the left channel and right channel share a common volume control and the click track channel has a separate dedicated volume control.

5. The device of claim 4 wherein the signal from the input feed is generated by an electronic drum module.

6. The device of claim 5, wherein the device is calibrated to be used with an instrument selected from the group consisting of a snare drum, bass drum, bong drum, tom-tom drum, a hi-hat, ride cymbal and crash cymbals.

* * * * *